(12) United States Patent
Engels et al.

(10) Patent No.: US 12,405,291 B2
(45) Date of Patent: Sep. 2, 2025

(54) GROUND REFERENCE LEAD FOR USE WITH ELECTRONICS TESTING AND MEASUREMENT PROBES

(71) Applicant: PMK Mess—und Kommunikationstechnik, GmbH, Bad Soden am Taunus (DE)

(72) Inventors: Michael Engels, Krefeld (DE); Philipp Palffy-Daun-Seiler, Bad Soden am Taunus (DE); Mark Heimann, Bad Soden am Taunus (DE); Nadja Laaperi, Koenigstein im Taunus (DE); Peter Hildenhagen, Alpen (DE); Kai Klein, Neu-Anspach (DE); Jurij Weber, Schwalbach am Taunus (DE); Thomas Podrebersek, Rheurdt (DE)

( * ) Notice: Subject to any disclaimer, the term of this patent is extended or adjusted under 35 U.S.C. 154(b) by 83 days.

(21) Appl. No.: 17/981,488

(22) Filed: Nov. 7, 2022

(65) Prior Publication Data

US 2024/0151745 A1 May 9, 2024

(51) Int. Cl.
*G01R 1/18* (2006.01)
*G01R 1/067* (2006.01)

(52) U.S. Cl.
CPC .......... *G01R 1/18* (2013.01); *G01R 1/06772* (2013.01)

(58) Field of Classification Search
CPC ... G01R 1/06772; G01R 1/18; G01R 1/06788
See application file for complete search history.

(56) References Cited

U.S. PATENT DOCUMENTS

| 4,838,802 A | * | 6/1989 | Soar | G01R 1/06772 |
| | | | | 439/502 |
| 2005/0116727 A9 | * | 6/2005 | Dascher | G01R 1/06772 |
| | | | | 324/715 |
| 2008/0048639 A1 | * | 2/2008 | Sutono | G01R 1/06772 |
| | | | | 324/76.19 |

FOREIGN PATENT DOCUMENTS

CN 109164340 A * 1/2019 ........... G01R 1/0416

* cited by examiner

*Primary Examiner* — Jermele M Hollington
*Assistant Examiner* — Taqi R Nasir
(74) *Attorney, Agent, or Firm* — Mederos Legal, PLLC; Diana Mederos

(57) ABSTRACT

Ground reference lead for measuring high frequency electrical signals using a probe head. The ground reference lead comprises a flexible body, a probe socket arranged on a probe end of the flexible body, a ground socket arranged on a ground end of the flexible body, an electrical contact pathway that electrically connects the probe socket and the ground socket and that extends at least partially within the flexible body, and a resistor that is electrically arranged in the electrical contact pathway.

15 Claims, 10 Drawing Sheets

GROUND REFERENCE LEAD FOR USE WITH ELECTRONICS TESTING AND MEASUREMENT PROBES

FIELD OF THE DISCLOSURE

The present disclosure relates to an apparatus for measuring electrical signals on a device under testing ("DUT"). More specifically, the disclosure relates to a ground reference lead for use with a probe head to measure high frequency electrical signals. Further, the present disclosure relates to a method for measuring high frequency electrical signals.

BACKGROUND OF THE DISCLOSURE

When measuring high frequency electrical signals on a DUT, it is desired to reliably obtain highest signal qualities for a wide range of DUTs and signal bandwidths.

When measuring high frequency electrical signals using a probe head, an input signal connection and a ground reference connection are required. Most probe heads comprise dedicated ports for electrical signal input and ground connection to which a signal input tip and a ground reference lead may be connected, respectively.

It has been observed that the self-inductance of the ground reference lead causes a degradation of the signal, especially for high frequency electrical signal measurements. This results in reduced rise time and higher overshoot, also known as ringing.

Current solutions to reduce ringing are impractical. One example is to reduce the self-inductance of the ground reference lead by adjusting its shape such as by using a circular cross section to reduce inductance. Deviations from the industry-standard flat, linear shape of the ground reference lead reduces flexibility, thereby reducing range of motion needed to reach grounding spots on the DUT.

Another example is to reduce the length of the ground reference lead. However, utilizing a shortened ground reference lead limits a measurement application to DUTs having sufficiently short distances between probing and grounding spots. Shortened ground reference leads can only be used with a narrow range of DUTs that satisfy the minimal distance between the probing and the grounding spots.

On the other hand, utilizing longer ground reference leads produces reduced signal qualities. Therefore, the reduced signal qualities inhibit accurate and precise DUT electrical signal measurements.

SUMMARY OF THE DISCLOSURE

What is needed is a ground reference lead showing reduced self-inductance driven signal degradation such that longer ground reference leads can be utilized in measurement applications using a probe head.

According to the present disclosure, a ground reference lead for measuring high frequency electrical signals using a probe head, the ground reference lead comprising a flexible body, a probe socket arranged on a probe end of the flexible body, a ground socket arranged on a ground end of the flexible body, an electrical contact pathway that electrically connects the probe socket and the ground socket and that extends at least partially within the flexible body, and a resistor that is electrically arranged in the electrical contact pathway.

In one embodiment, the flexible body comprises an electrically conductive core and an electrically insulating cover.

In one embodiment, the flexible body has a strip shape and comprises a copper strip covered by a glass-reinforced epoxy laminate material.

In one embodiment, the flexible body has a total thickness of less than 0.8 mm.

In one embodiment, the ground reference lead further comprises a probe socket plate mounted to the probe end of the flexible body, and a ground socket plated mounted to the ground end of the flexible body, wherein the probe socket is mounted to the probe socket plate and wherein the ground socket is mounted to the ground socket plate.

In one embodiment, the probe socket plate is mounted to a front side of the flexible body and the resistor is mounted to a back side of the flexible body, and/or wherein the ground socket plate is mounted to a front side of the flexible body and the resistor is mounted to a back side of the flexible body.

In one embodiment, the probe socket plate and/or the ground socket plate are made of an electrically insulating material and comprise a through-hole for the electrically conducting pathway.

In one embodiment, the resistor comprises a probe end resistor and/or a ground end resistor, wherein the probe end resistor and/or the ground resistor comprise one, two, or more individual resistors.

In one embodiment, the probe socket and the ground socket are made of an electrically conductive material, wherein the probe socket is configured to be mounted to a ground port of a probe head and wherein the ground socket is configured to receive a ground tip.

In one embodiment, the ground reference lead comprises a probe socket cover and a ground socket cover, wherein the probe socket cover and the ground socket cover are configured to be releasably mounted to the probe socket and the ground socket, respectively.

In one embodiment, the probe socket cover and the ground socket cover are made of an electrically insulating material.

In one embodiment, the ground socket cover comprises a mounting surface configured such that the ground socket can be held in place during operation using a human hand, a robotic arm, and/or tools.

A measuring apparatus for measuring high frequency electrical signals on a DUT is provided. The measuring apparatus for measuring high frequency electrical signals on a DUT, the measuring apparatus comprising a probe head having an electrical signal input port, and a high impedance ground connection port, an electrical signal input tip mounted to the electrical signal input port, and the ground reference lead according to the present disclosure mounted to the high impedance ground connection port via the probe socket.

In one embodiment, the probe head is an active probe head.

In one embodiment, the measuring apparatus further comprises a moveable probe head support arm and/or a moveable ground tip support arm.

A method of using the ground reference lead of claim 1 to measure high frequency electrical signals on a DUT, the method steps comprising mounting an electrical signal input tip to an electrical signal input port of a probe head, mounting the ground reference lead according to the present disclosure to a high impedance ground connection port of the probe head by connecting the probe socket of the ground reference lead to the high impedance ground connection port, powering the probe head and connecting it to a data acquisition device, contacting a signal line on the DUT with the probe tip, contacting a ground pad on the DUT with the ground tip, performing measurement of high frequency electrical signals at no substantial self-inductance driven signal quality loss.

BRIEF DESCRIPTION OF THE DRAWINGS

The accompanying drawings that are incorporated in and constitute a part of this specification illustrate several embodiments of the disclosure. Together with the description, they serve to explain the principles of the disclosure.

Figure 10:
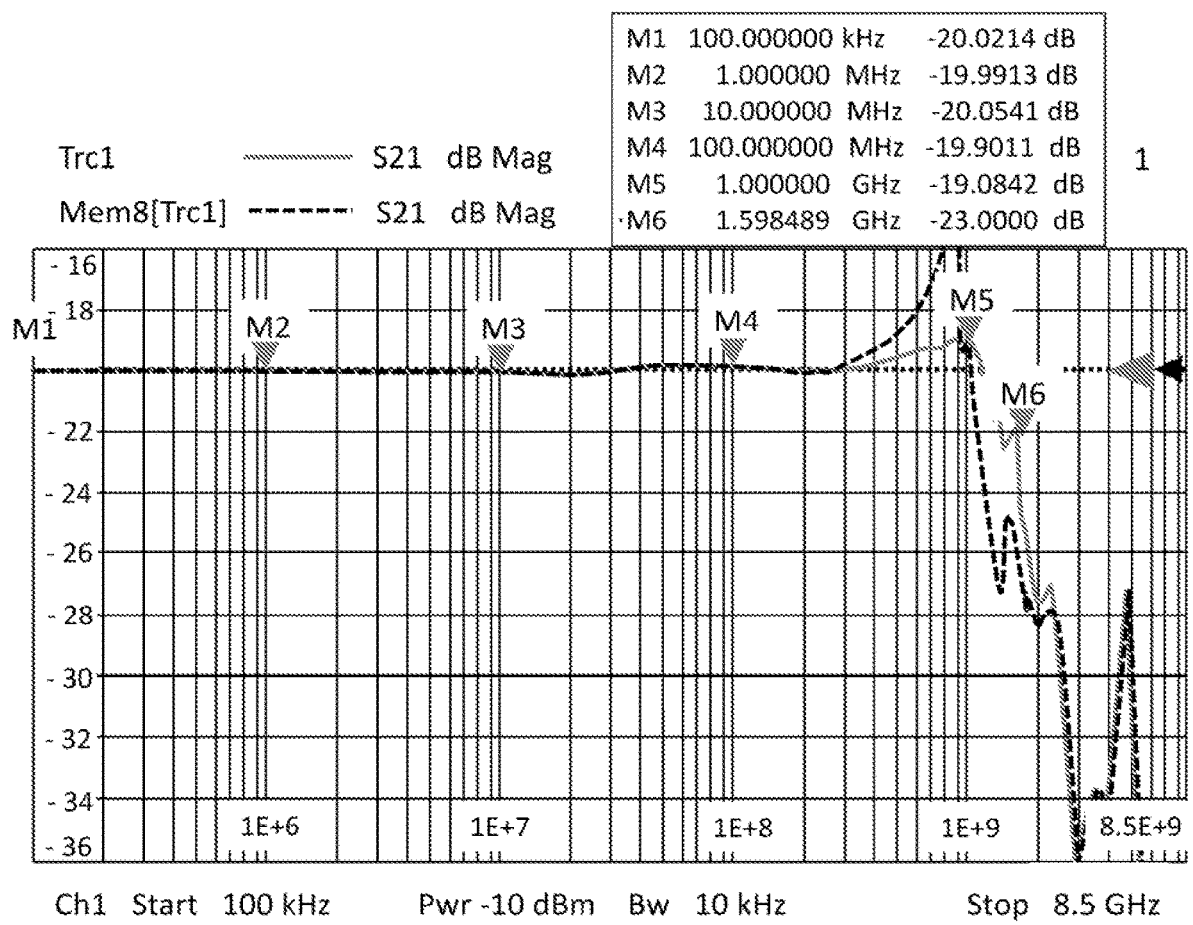
FIG. 10 illustrates a measured signal in a frequency domain using a double logarithmic diagram for a flexible length of 52 mm.

REFERENCE NUMERALS OF THE FIGURES 10 ground reference lead
12 flexible body
14 probe socket
16 probe end
18 ground socket
19 protruding cylinder
20 ground end
21 ground socket cylinder shaft axis
22 electrical contact pathway
23 longitudinal axis of the flexible body
24 resistor
25 body axis of the ground socket
26 copper strip
28 glass-reinforced epoxy laminate material
30 probe socket plate
32 ground socket plate
34 flexible length
36 front side
38 back side
40 through-hole
42 probe socket electrical connection link
44 ground socket electrical connection link
46 ground tip receptacle
48 probe connection pin
49 probe connection pin body axis
50 ground tip
52 ground socket cover
54 mounting surface
56 probe socket cover
100 measuring apparatus
200 probe head
202 electrical signal input port
204 high impedance ground connection port
206 electrical signal input tip
300 test board
302 signal line
304 ground pad

DETAILED DESCRIPTION

The present disclosure provides generally for methods and apparatuses for measuring high frequency electrical signals using a probe head. According to the present disclosure, a ground reference lead comprises a flexible body, a probe socket arranged on a probe end of the flexible body, a ground socket arranged on a ground end of the flexible body, an electrical contact pathway that electrically connects the probe socket and the ground socket and that extends at least partially within the flexible body, and a resistor that is electrically arranged in the electrical contact pathway.

Having the resistor electrically arranged in the electrical contact pathway allows for cancellation of self-inductances generated by the ground reference lead when utilized in a probe head during high frequency electrical signal measurements. Because the self-inductance is cancelled, the flexible body can be provided at a length that allows reaching more distant ground spots on a device under testing, DUT. This has the potential to use the ground reference lead for a wide range of DUTs without observing self-inductance-driven signal losses caused by the ground reference lead.

In the following sections, detailed descriptions of examples and methods of the disclosure will be given. The description of both preferred and alternative examples are exemplary only, and it is understood that to those skilled in the art that variations, modifications, and alterations may be apparent. It is therefore to be understood that the examples do not limit the broadness of the aspects of the underlying disclosure as defined by the claims.

Generally, the exemplary apparatus described herein is a ground reference lead to be used in combination with a probe head for high frequency electrical signal measuring applications.

In the sense of the present disclosure, a ground reference lead may be understood as an auxiliary component designed to be used in combination with a probe head. When measuring electrical signals using a probe, a ground reference connection is required. Therefore, measurement probes are coupled with different types of ground connections for providing a ground reference during signal acquisition. With the ground reference lead, an electrical contact between a grounding spot on a DUT and a grounding port of the probe head can be established.

The ground reference lead can be used with a variety of probes such mobile, hand-held, or those maneuvered by a robotic arm. The probe head may be an active probe head for high frequency electrical signal measurements. The probe head may be connected to a signal output cable, for example a 6 m cable. The cable may be a single shield cable. The probe head may comprise a compensation circuit balancing attenuation caused by the signal output cable.

A probe head according to the present disclosure may comprise a dedicated grounding port configured to receive various types of ground reference leads. In addition, a probe head according to the present disclosure may also comprise a dedicated signal input port configured to receive various types of signal input tips.

Measuring electrical signals with such a probe head requires contacting a probing spot on a DUT with a signal input tip and a grounding spot on a DUT with the ground reference lead.

Providing a ground reference lead according to the present disclosure allows compensating self-inductance of the ground reference lead, thereby obtaining a high quality signal measured at the signal input tip mounted to the probe head.

It was found that using dedicated resistors in the ground reference lead compensates for self-inductances of the ground reference lead. Such equipped ground reference lead length has a reduced impact on self-inductance driven signal quality loss during measurements of high frequency electrical signals. As a result, a ground reference lead can be designed longer, thereby allowing a wider range of measurement applications, in particular applications where a DUT probing spot is provided at a larger distance to a DUT grounding spot.

The detrimental effect of ground reference lead self-inductance can be compensated by providing a resistor in the electrical connection between a ground tip and a probe connector.

In the following sections, detailed descriptions of examples and methods of the disclosure will be given. The description of both preferred and alternative examples are exemplary only, and it is understood that to those skilled in the art that variations, modifications, and alterations may be apparent. It is therefore to be understood that the examples do not limit the broadness of the aspects of the underlying disclosure as defined by the claims.

GLOSSARY

"high frequency" as used herein means a frequency of 100 MHz or higher.

"probe head" as used herein means an active, compensated, single ended probe head suitable for, but not necessarily limited to, high frequency electrical signal measurements.

DETAILED DESCRIPTIONS OF THE DRAWINGS

Figure 1:
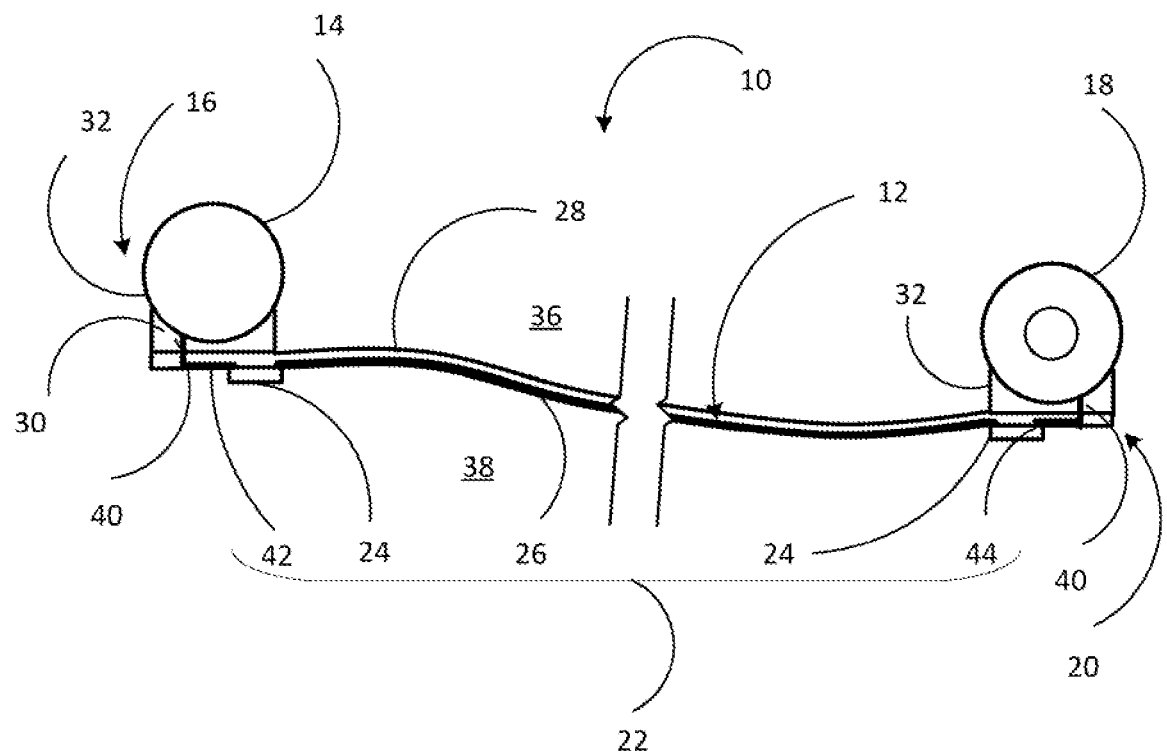
FIG. 1 illustrates a schematic cross-sectional side view of an exemplary ground reference lead having resistors.

Referring now to FIG. 1, a schematic cross-sectional side view of a ground reference lead having resistors is illustrated. A ground reference lead 10 may comprise a flexible body 12, a probe socket 14 arranged on a probe end 16 of the flexible body 12, a ground socket 18 arranged on a ground end 20 of the flexible body 12, an electrical contact pathway 22 that electrically connects the probe socket 14 and the ground socket 18 and that extends at least partially within the flexible body 12, and a resistor 24 that is electrically arranged in the electrical contact pathway 22. In the demonstration of FIG. 1, the flexible body 12 is slightly bent in an S-curve. The flexible body 12 may be configured to allow any distance of the probe socket 14 relative to the ground socket 18 from 0 to the distance reached when the flexible body 12 is straight. In some embodiments, the conductive strip 12 may also be torsionally flexible.

The flexible body 12 may be a composite part in the form of a layered or sandwiched component. The flexible body 12 may comprise an electrically conductive core and an electrically insulating cover. In FIG. 1, the flexible body 12 has a strip shape and comprises a copper strip 26 covered by a glass-reinforced epoxy laminate material 28, also known as FR-4. The copper strip may have a thickness of 50 mikrometer and wherein the glass-reinforced epoxy laminate material has a thickness of 0.1 mm.

The ground reference lead 10 further comprises a probe socket plate 30 mounted to the probe end 16 of the flexible body 12 and a ground socket plate 32 mounted to the ground end 20 of the flexible body 12. The probe socket 14 is mounted to the probe socket plate 30, wherein the ground socket 18 is mounted to the ground socket plate 32. The probe socket plate 30 is mounted directly onto the flexible body 12. In the area where the probe socket plate 30 contacts the flexible body 12, the flexible body 12 is rigid. Flexibility is provided only along the flexible length 34 of the flexible body 12, extending between the probe socket plate 30 and the ground socket plate 32.

In some embodiments, the probe socket plate 30 and the ground socket plate 32 may be mounted to a front side 36 of the flexible body 12. The resistor 24 may be mounted to a back side 38 of the flexible body 12.

In some embodiments, the probe socket plate 30 and the ground socket plate 32 are made of an electrically insulating material and each comprise a through-hole 40 for the electrical contact pathway 22.

In some embodiments, the resistor 24 may comprise a probe end resistor and a ground end resistor. The probe end resistor and the ground end resistor may each comprise three individual resistors arranged in parallel.

The electrical contact pathway 22 extends over the entire flexible length 34 of the flexible body 12. In the flexible body 12, the copper strip 26 is arranged. Upon reaching the area where the probe socket plate 30 contacts the flexible body 12, where the probe end resistor is provided, the copper strip 26 ends and the electrical contact pathway 22 leads through the probe end resistor into a probe socket electrical connection link 42. Upon reaching the area where the ground socket plate 32 contacts the flexible body 12, where the ground end resistor is provided, the copper strip 26 ends and the electrical contact pathway 22 leads through the ground end resistor into a ground socket electrical connection link 44. The ground socket electrical connection link 44 and the probe socket electrical connection link 42 each run through their respective trough-hole 40, thereby establishing the electrical contact pathway 22 between the probe socket 14 and the ground socket 18.

According to some embodiments, the flexible body 12 may for example comprise flexible printed circuit board, ("PCB"). The PCB may be a single layer, double layer, multiple layer board. The PCB may further comprise polyimide and/or a transparent polyester film as a substrate material having heat resistance properties suitable for solder mounting components onto the PCB, for example the ground tip, the probe connector, and/or the resistor. The PCB may comprise a conductive layer of traces made of copper in combination with a polyimide dielectric layer. The thickness of the copper conductive layer can vary from about 0.0001 inches to about 0.01 inches. The thickness of the dielectric material can range from about 0.0005 inches to about 0.01 inches. The copper conductive layer and the dielectric layer may be bonded using an adhesive or using vapor deposition technique.

Figure 2:
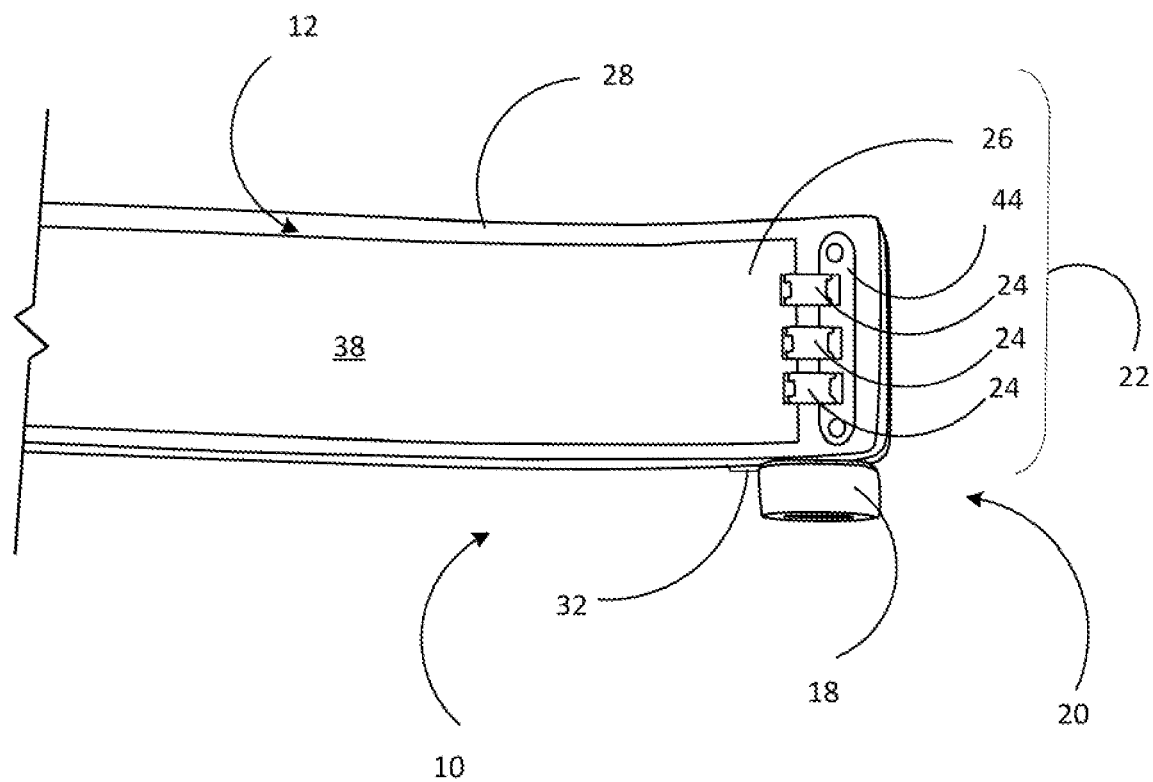
FIG. 2 illustrates a ground end of the exemplary ground reference lead of FIG. 1 in a bottom view showing the resistor.

Referring now to FIG. 2, the ground end of the exemplary ground reference lead of FIG. 1 is shown as seen from the back side. In some embodiments, the ground reference lead 10 may comprise a flexible body 12, and a ground socket 18 arranged on a ground end 20 of the flexible body 12. The flexible body 12 may comprise an electrically conductive core and an electrically insulating cover. The flexible body 12 may have a strip shape and may comprise a copper strip 26 and a glass-reinforced epoxy laminate material 28, also known as FR-4. In some embodiments, the ground reference lead 10 may further comprise a ground socket plate 32 mounted to the ground end 20 of the flexible body 12. The ground socket 18 may be mounted to the ground socket plate 32. In some embodiments, the ground socket plate 32 may be mounted to a front side of the flexible body 12 and the resistor 24 may be mounted to a back side 38 of the flexible body 12.

In some embodiments, the ground socket 18 may be made of an electrically conductive material. In some embodiments, the resistor 24 may comprise a ground end resistor. The ground end resistor may consist of three individual resistors arranged in parallel. Each individual resistor 24 may be a surface mount resistor. Each individual resistor may have a resistance of 3 Ohm. The total resistance of the three resistors may therefore be . . . Ohm.

In some embodiments, the ground reference lead 10 may comprise a ground socket electrical connection link 44, connecting the ground socket 18 to the resistors 24. The ground socket electrical connection link 44 may be embedded into the glass-reinforced epoxy laminate material 28 such that an electrical contact is provided on the front side (see FIG. 3) facing the ground socket 18. Starting from the ground socket 18, the components of the electrical path 22 may be the ground socket 18, the ground socket electrical connection link 44, the three parallel surface mount resistors 24, and the copper strip 26. In some embodiments, the ground socket 18, the ground socket electrical connection link 44, the surface mount resistors 24, and the copper strip 26 may be soldered together.

Figure 3:
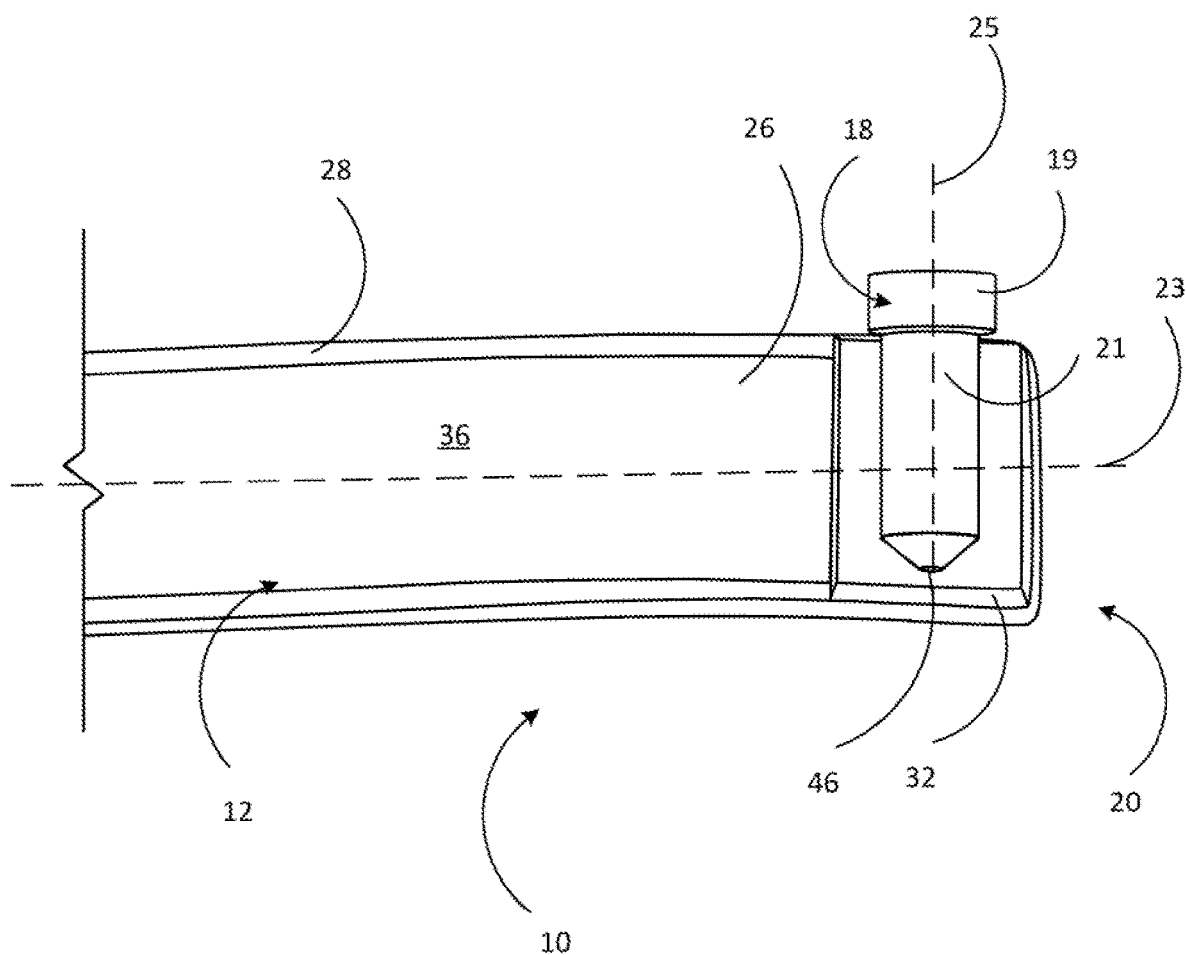
FIG. 3 illustrates the ground end of the exemplary ground reference lead of FIG. 1 in a top view showing the ground socket.

Referring now to FIG. 3, the ground end of the exemplary ground reference lead of FIG. 1 is shown as seen from the front side. FIG. 3 represents the FIG. 2 flipped from its back side to its front side 36. In some embodiments, the ground socket plate 32 may have a rectangular cross-section. The ground socket plate 32 may be fixedly mounted to the flexible body 12, for example via gluing. The ground socket plate 32 may be flush with the glass-reinforced epoxy laminate material 28 of the flexible body 12. The ground socket 18 may comprise a protruding cylinder 19, arranged orthogonally to a longitudinal axis 23 of the flexible body 12 and protruding beyond the flexible body 12. The ground socket 18 may further comprise a ground socket cylinder shaft 21, arranged centered on the ground socket plate 32 and orthogonally to the longitudinal axis 23 of the flexible body 12.

In some embodiments, the ground socket 18 may comprise a ground tip receptacle 46, which may comprise a cylindrical hole provided along a body axis 25 of the ground socket 18. The ground tip receptacle 46 is configured to receive a ground tip 50, see FIG. 6, which may be releasably inserted into the receptacle 46 along the body axis 25 of the ground socket 18.

Figure 4:
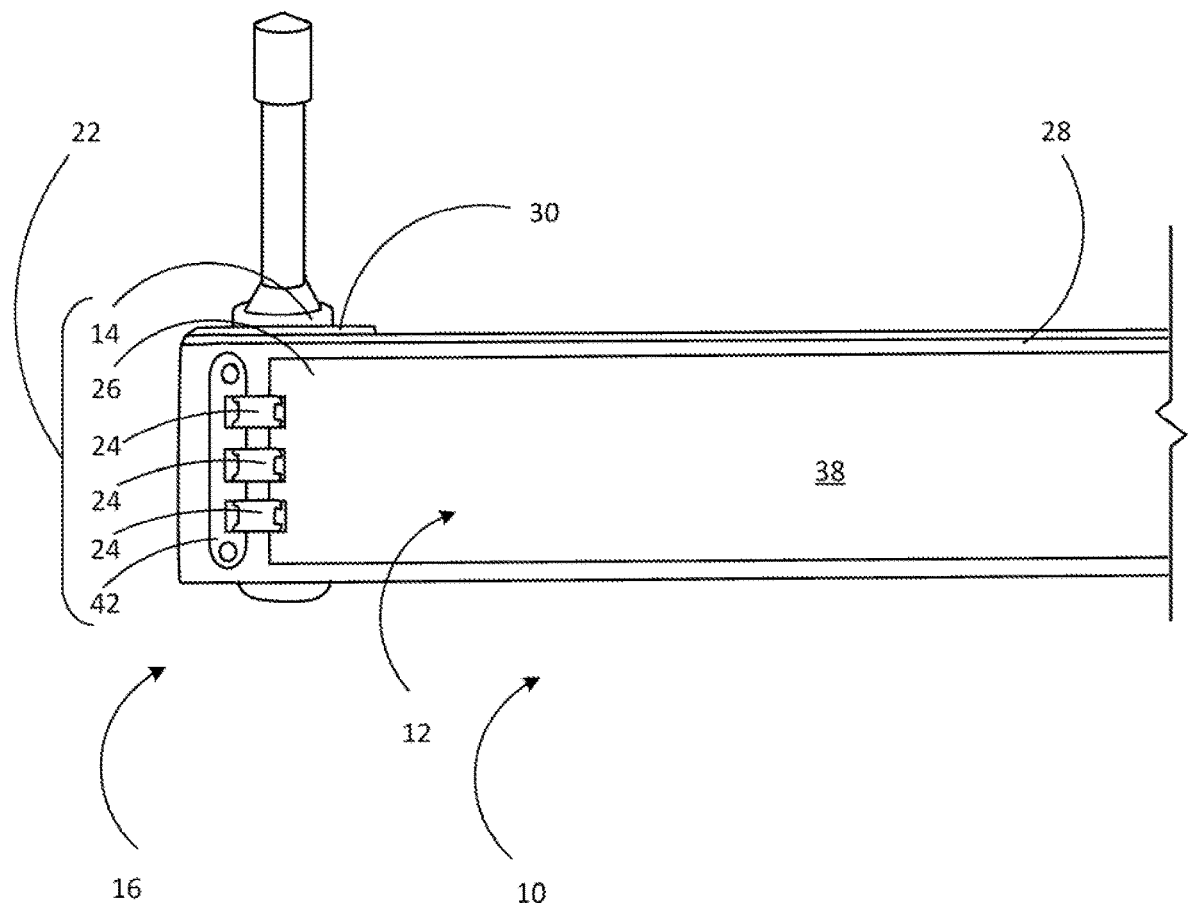
FIG. 4 illustrates the probe head end of the exemplary ground reference lead of FIG. 1 in a bottom view showing the resistor.

Referring now to FIG. 4, the probe end of the exemplary ground reference lead of FIG. 1 is shown as seen from the back side. In some embodiments, the ground reference lead 10 may comprise a flexible body 12, and a probe socket 14 arranged on a probe end 16 of the flexible body 12. The flexible body 12 may comprise an electrically conductive core and an electrically insulating cover. The flexible body 12 may have a strip shape and may comprise a copper strip 26 and a glass-reinforced epoxy laminate material 28, also known as FR-4. In some embodiments, the ground reference lead 10 may further comprise a probe socket plate 30 mounted to the probe end 16 of the flexible body 12. The probe socket 14 may be mounted to the probe socket plate 30. In some embodiments, the probe socket plate 30 may be mounted to a front side of the flexible body 12 and the resistor 24 may be mounted to a back side 38 of the flexible body 12.

In some embodiments, the probe socket 14 may be made of an electrically conductive material. In some embodiments, the resistor 24 may comprise a probe end resistor. The probe end resistor may consist of three individual resistors arranged in parallel. Each individual resistor 24 may be a surface mount resistor. Each individual resistor may have a resistance of 180 Ohm. The total resistance of the three resistors may be 60 Ohm.

In some embodiments, the ground reference lead 10 may comprise a probe socket electrical connection link 42, connecting the probe socket 14 to the resistors 24. The probe socket electrical connection link 42 may be embedded into the glass-reinforced epoxy laminate material 28 such that an electrical contact is provided on the front side (see FIG. 5) facing the probe socket 14. Starting from the probe socket 14, the components of the electrical path 22 may be the probe socket 14, the probe socket electrical connection link 42, the three parallel surface mount resistors 24, and the copper strip 26. In some embodiments, the probe socket 14, the probe socket electrical connection link 42, the surface mount resistors 24, and the copper strip 26 may be soldered together.

Figure 5:
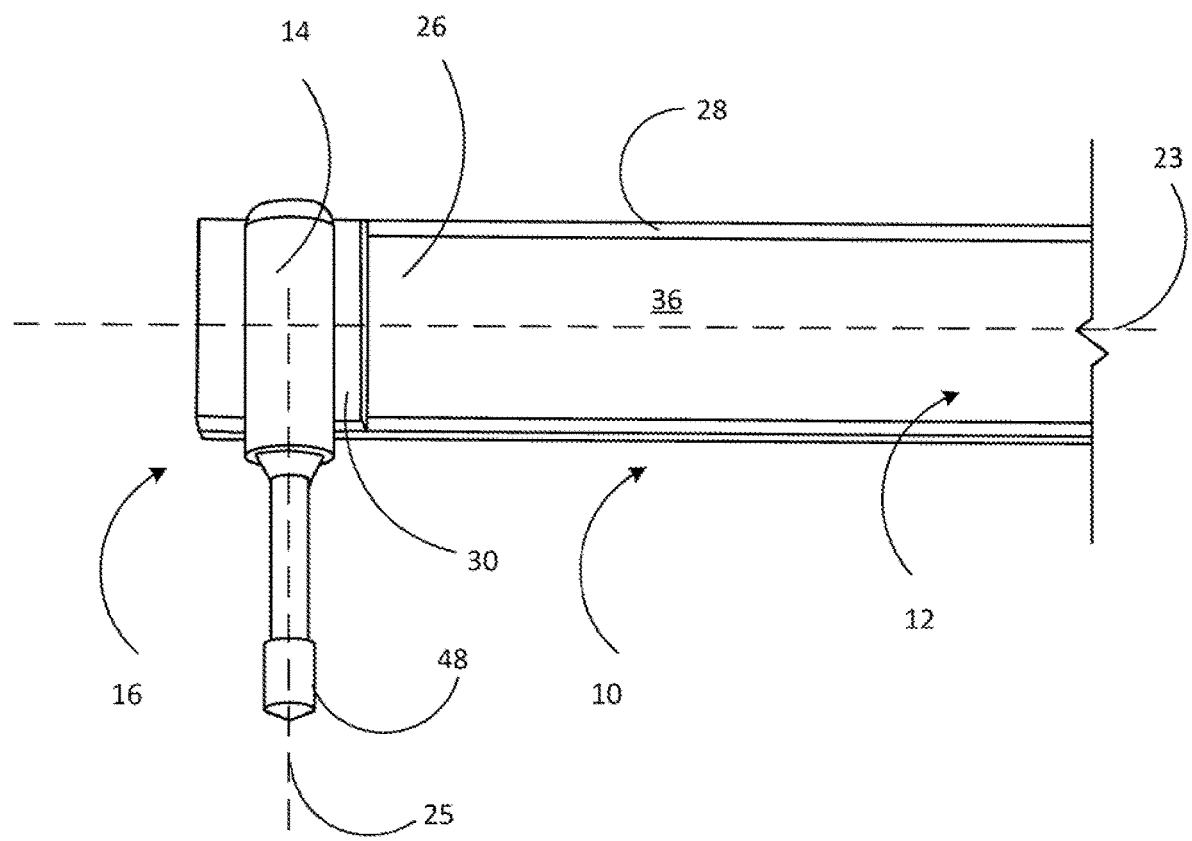
FIG. 5 illustrates the probe head end of the exemplary ground reference lead of FIG. 1 in a top view showing the probe head socket.

Referring now to FIG. 5, the probe end of the exemplary ground reference lead of FIG. 1 is shown as seen from the front side. FIG. 5 represents the FIG. 4 flipped from its back side to its front side 36. In some embodiments, the probe socket plate 30 may have a rectangular cross-section. The probe socket plate 30 may be fixedly mounted to the flexible body 12, for example via gluing. The probe socket plate 30 may be flush with the glass-reinforced epoxy laminate material 28 of the flexible body 12. The probe socket 14 may comprise a probe connection pin 48, arranged orthogonally to a longitudinal axis 23 of the flexible body 12 and protruding beyond the flexible body 12. The probe connection pin 48 is configured to be inserted into a female ground port 204 of a probe head 200 shown in FIG. 7. The probe connection pin 48 may be releasably inserted into the receptacle 46 along a probe connection pin body axis 49.

Figure 6:
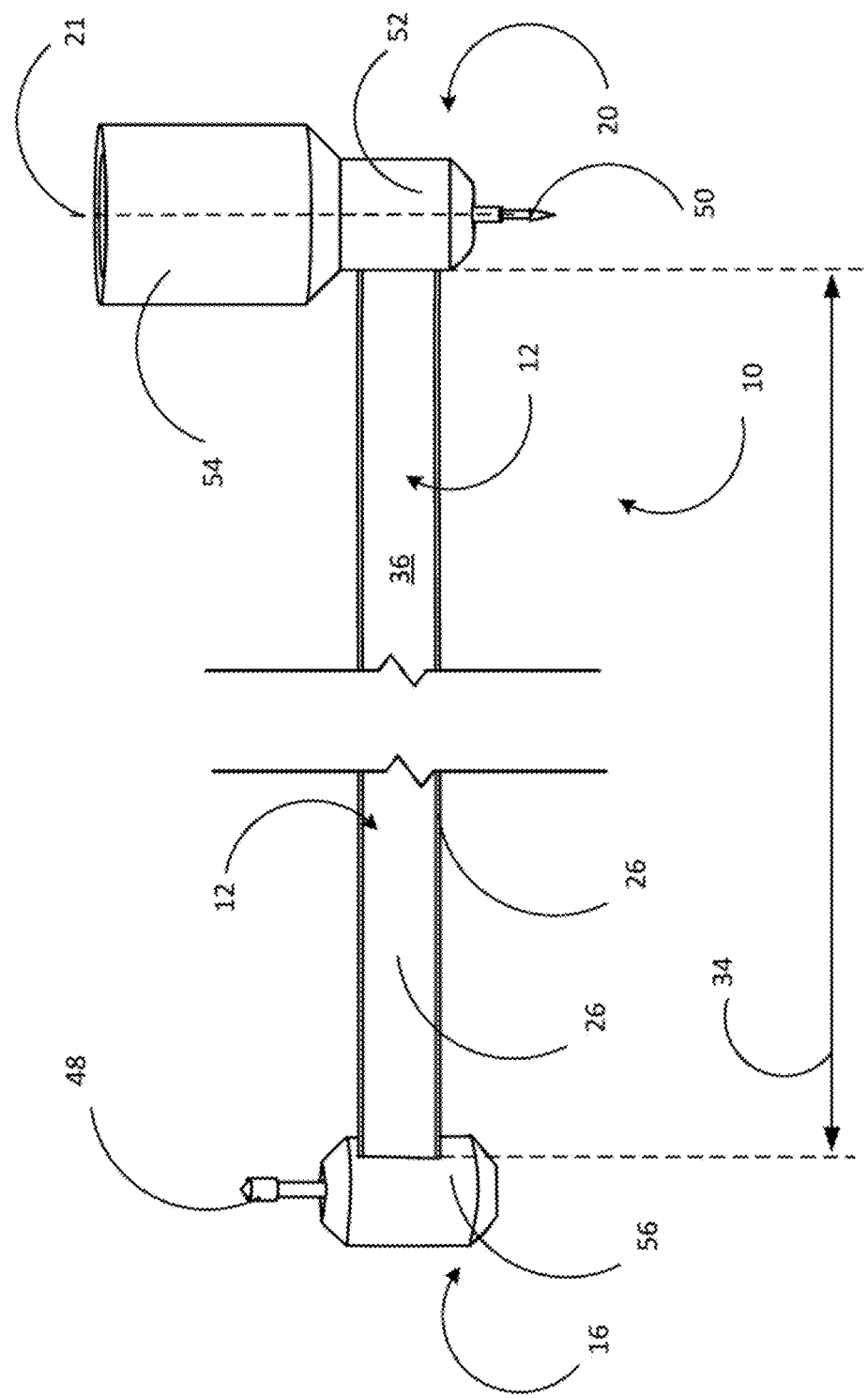
FIG. 6 illustrates the exemplary ground reference lead of FIG. 1 in a top view with a ground tip mounted to the ground socket and electrical insulators mounted to the ground socket and the probe head socket.

Referring now to FIG. 6, an exemplary embodiment of a ground reference lead is shown in a front side view. The ground reference lead 10 may be the ground reference lead as disclosed in FIGS. 2-5. The same principles, definitions, and explanations apply where applicable. The ground reference lead 10 may comprise a flexible body 12 having a flexible length 34. In some embodiments, the flexible length 34 may for example be greater than 3 cm or greater than 5 cm.

In some embodiments, the ground socket 18 and the probe socket 14 are made of an electrically conductive material. The probe socket 14 may be configured to be mounted to a ground port of a probe head via the probe head connection pin 48. The ground socket 18 may be configured to receive a ground tip 50. In the demonstration shown in FIG. 5, a ground tip 50 is mounted to the ground socket.

In some embodiments, the ground reference lead 10 may further comprise a probe socket cover 56 and a ground socket cover 52. The probe socket cover 56 and the ground socket cover 52 may be electrically insulated, thereby shielding the probe socket 14 and the ground socket 18, respectively. The probe socket cover 56 and the ground socket cover 52 may each comprise two substantially hollow-cylindrical half-shells that can be assembled and disassembled and thereby releasably mounted to the probe socket and the ground socket, respectively.

In some embodiments, the ground socket cover 52 may comprise a mounting surface 54 configured such that the ground socket can be held in place using a human hand, a robotic arm, and/or tools. The mounting surface 54 may be placed along the ground socket cylinder shaft axis 21 and beyond the flexible body 12, allowing a safe distance between auxiliary fastening means and the flexible body 12. The mounting surface 54 can be conveniently adjusted to match external geometric requirements for securing the mounting surface 54 appropriately.

Figure 7:
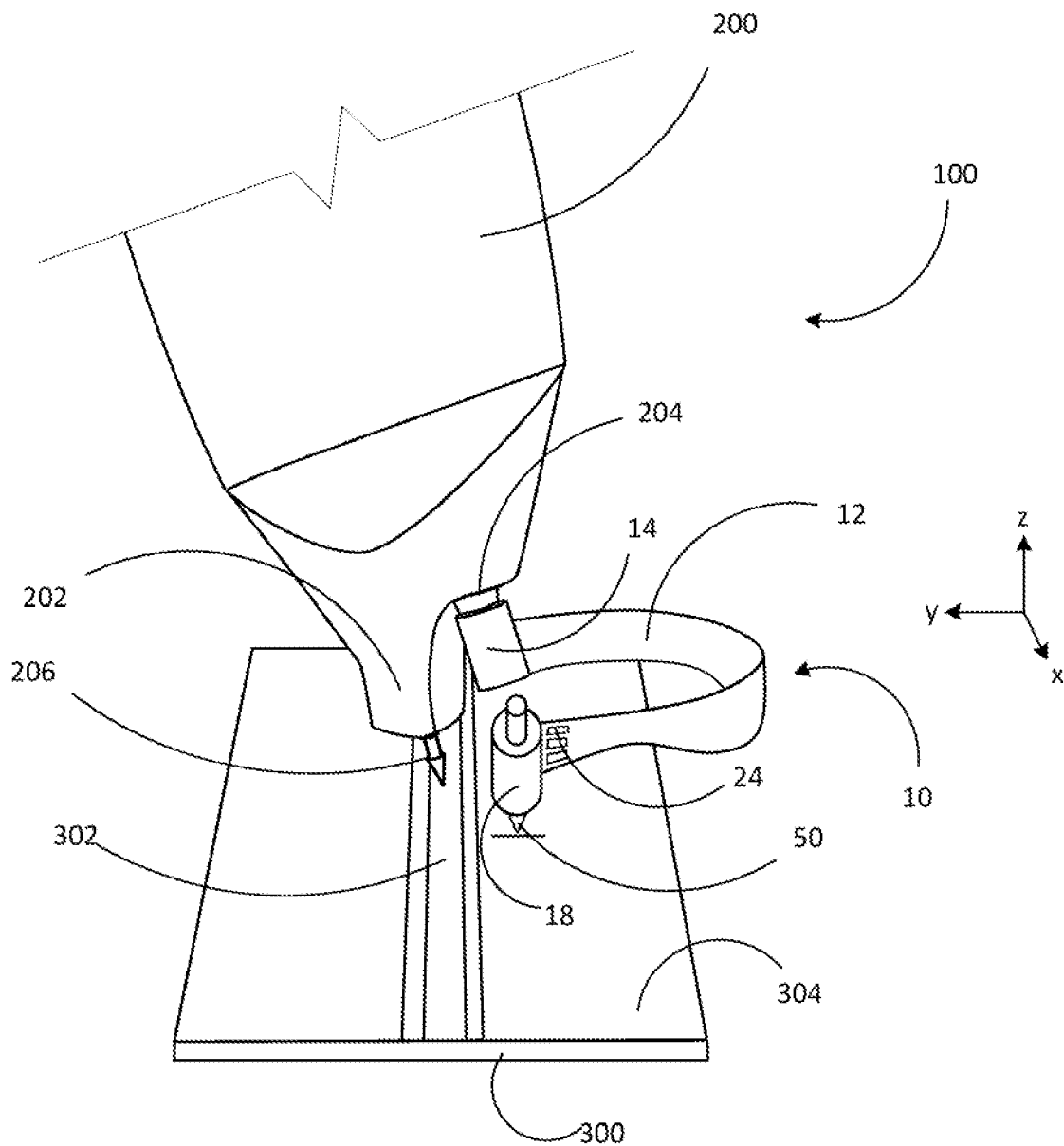
FIG. 7 illustrates an exemplary measurement apparatus comprising the ground reference lead of FIG. 1 in a perspective view engaging a test board.

Referring now to FIG. 7, an exemplary embodiment of a measuring apparatus for measuring high frequency electrical signals on a DUT is illustrated in a perspective view. In some embodiments, the measuring apparatus 100 may comprise a probe head 200 having an electrical signal input port 202 and a high impedance ground connection port 204. The measuring apparatus 100 may further comprise an electrical signal input tip 206 mounted to the electrical signal input port. The measuring apparatus 100 may further comprise the ground reference lead 10 according to the present disclosure mounted to the high impedance ground connection port 204 via the probe socket 14 of the ground reference lead 10. The ground reference lead 10 may further comprise a ground tip 50 mounted to the ground socket 18 of the ground reference lead 10. The ground tip 50 may contact the test board 300 on a ground pad 304.

The input tip 206 may be placed on a signal line 302 of a DUT. The DUT is demonstrated in FIG. 7 by a test board 300. Real DUTs usually have only few options to place a ground tip 50 when measuring a given signal line on a circuit board or the like. The flexible body 12 allows placing the ground tip 50 at various locations spaced apart from the electrical signal input tip 206. Due to the resistors 24 of the ground reference lead 10, self-inductance of the ground reference lead 10 may be compensated, irrespective of the relative distance between electrical signal input tip 206 and ground tip 50.

Figure 8:
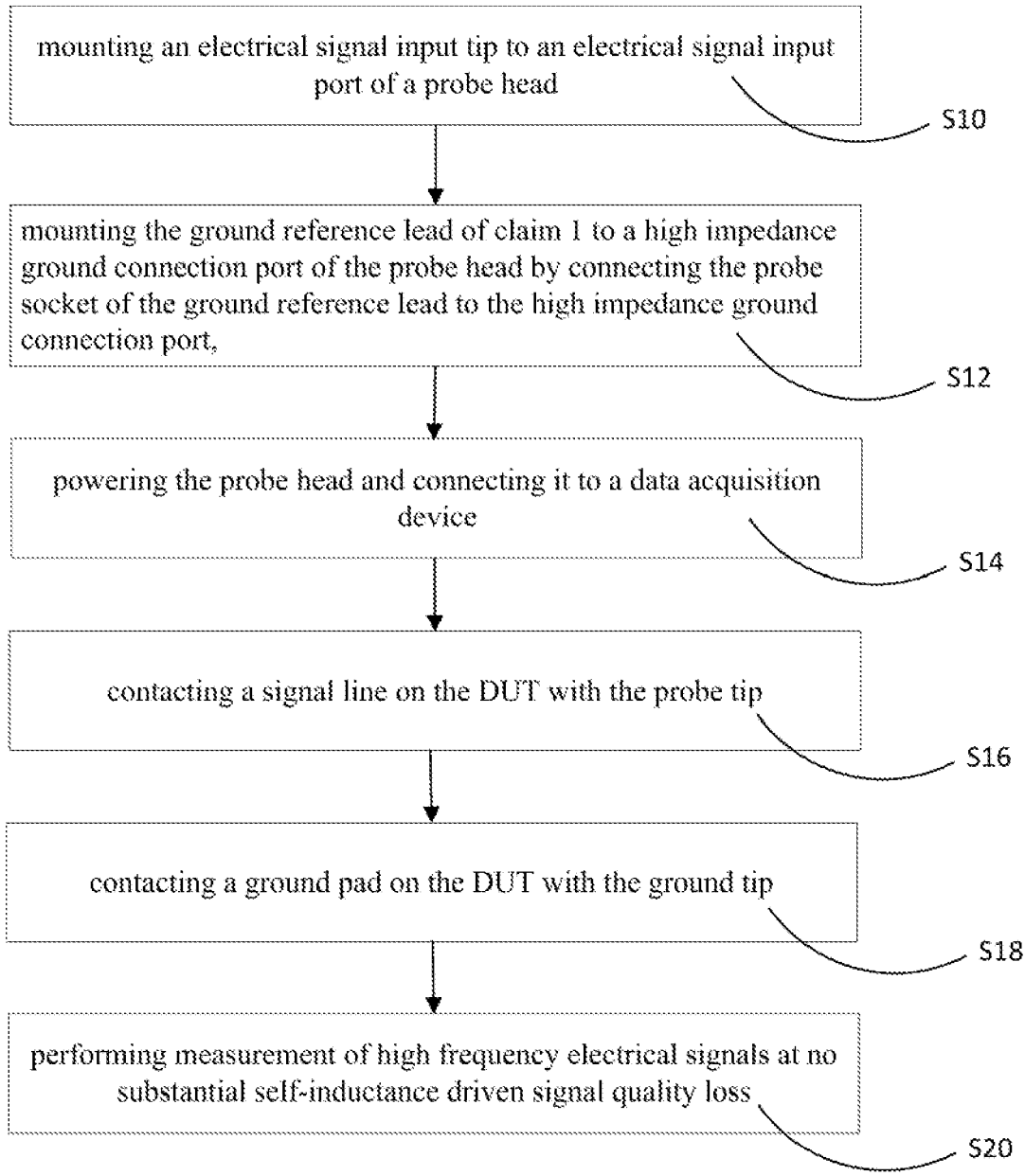
FIG. 8 illustrates exemplary method steps for using a ground reference lead to perform high frequency electrical signal measurement using a probe head.

Referring now to FIG. 8, a schematic flow chart of an exemplary measuring method of using the ground reference lead according to the present disclosure to measure high frequency electrical signals on a DUT is illustrated. In some method steps, an operator may perform mounting S10 an electrical signal input tip to an electrical signal input port of a probe head. An operator may perform mounting S12 the ground reference lead of claim 1 to a high impedance ground connection port of the probe head by connecting the probe socket of the ground reference lead to the high impedance ground connection port. An operator may perform powering S14 the probe head and connecting it to a data acquisition device. A step of contacting S16 a signal line on the DUT with the probe tip may be conducted. An operator may perform contacting S18 a ground pad on the DUT with the ground tip. A step of performing S20 a measurement of high frequency electrical signals at no substantial self-inductance driven signal quality loss.

Figure 9:
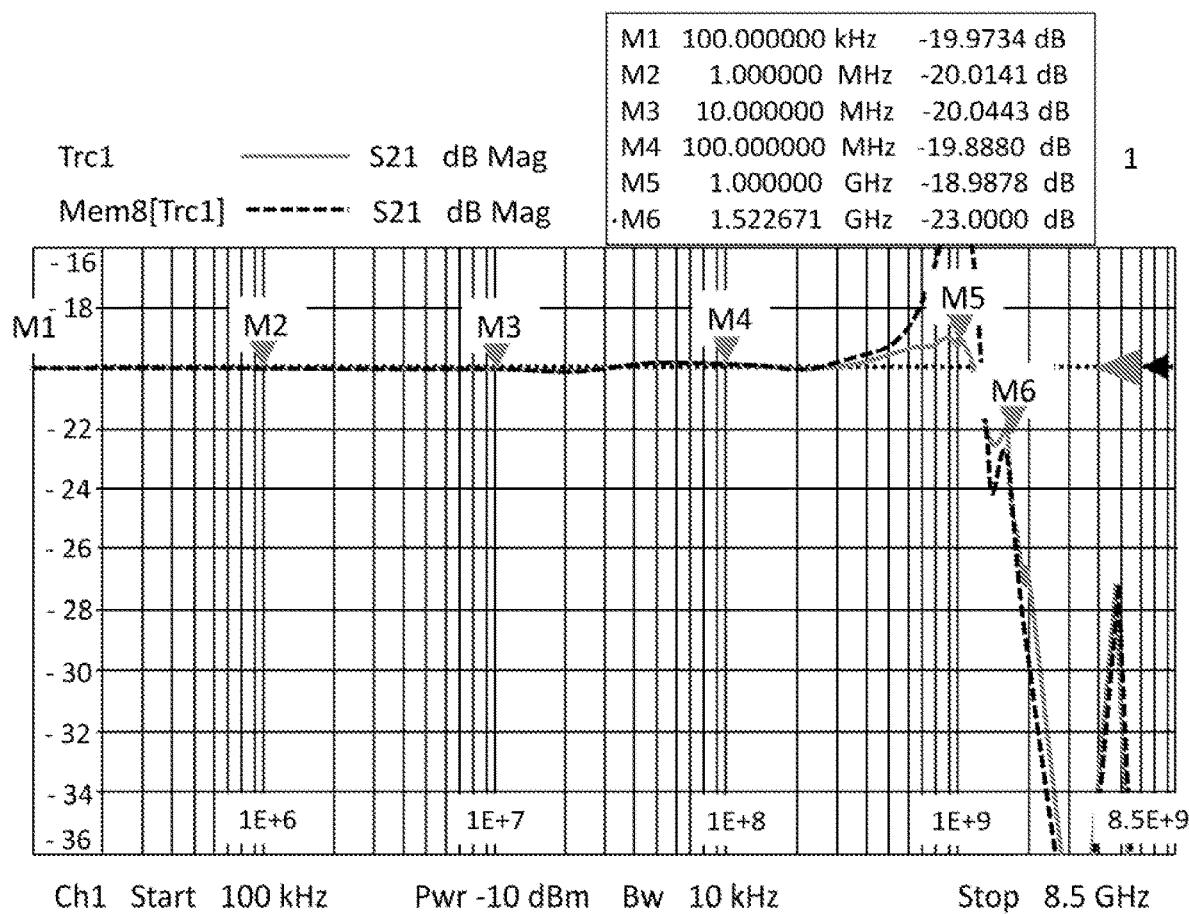
FIG. 9 illustrates a measured signal in a frequency domain using a double logarithmic diagram for a flexible length of 32 mm.

Referring now to FIG. 9, a measured signal in a frequency domain using a double logarithmic diagram for a flexible length of 32 mm is shown.

The used probe head was a compensated active probe head using a 6 m single shielded signal output cable. The attenuation caused by the cable was compensated by the compensation circuit of the probe head.

The solid line represents experiments using three 180 Ohm resistors in parallel, resulting in 60 Ohm. The inductance of the 32 mm ground reference lead was around 14 nH. The dotted line represents a ground reference lead of the same dimensions yet without the resistors.

As indicated at point MS in the frequency domain plot (solid line), at a bandwidth of 1.52 GHz, only 1.0 dB peaking and 11% overshoot were observed. The cut-off frequency of 3 dB, Point M6, was breached at a higher bandwidth in the experiments using the resistors.

Referring now to FIG. 10, a measured signal in a frequency domain using a double logarithmic diagram for a flexible length of 52 mm is shown. The measured frequency domain characteristic was measured using an active high frequency probe with a 52 mm ground reference lead according to the disclosure.

The used probe head was a compensated active probe head using a 6 m single shielded signal output cable. The attenuation caused by the cable was compensated by the compensation circuit of the probe head.

The solid line represents experiments using three 180 Ohm resistors in parallel, resulting in 60 Ohm. The inductance of the 52 mm ground reference lead was around 14 nH. The dotted line represents a ground reference lead of the same dimensions yet without the resistors.

CONCLUSION

A number of embodiments of the present disclosure have been described. While this specification contains many specific implementation details, these details should not be construed as limitations on the scope of any disclosures or of what may be claimed.

Certain features that are described in this specification in the context of separate embodiments can also be implemented in combination in a single embodiment. Conversely, various features that are described in the context of a single embodiment can also be implemented in combination in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order show, or sequential order, to achieve desirable results. In certain implementations, multitasking and parallel processing may be advantageous. Nevertheless, it will be understood that various modifications may be made without departing from the spirit and scope of the claimed disclosure.

What is claimed is:

1. A ground reference lead for measuring high frequency electrical signals using a probe head, the ground reference lead comprising:
   a. a flexible body,
   b. a probe socket arranged on a probe end of the flexible body,
   c. a ground socket arranged on a ground end of the flexible body,
   d. an electrical contact pathway that electrically connects the probe socket and the ground socket and that extends at least partially within the flexible body,
   e. a resistor, and
   f. a probe socket plate mounted to the probe end of the flexible body and a ground socket plate mounted to the ground end of the flexible body, wherein the probe socket is mounted to the probe socket plate and wherein the ground socket is mounted to the ground socket plate.

2. The ground reference lead according to claim 1, wherein flexible body has a total thickness of less than 0.8 mm.

3. The ground reference lead according to claim 1, wherein the probe socket and the ground socket are made of an electrically conductive material, wherein the probe socket is configured to be mounted to a ground port of the probe head and wherein the ground socket is configured to receive a ground tip.

4. The ground reference lead according to claim 1, further comprising a probe socket cover and a ground socket cover, wherein the probe socket cover and the ground socket cover are configured to be releasably mounted to the probe socket and the ground socket, respectively.

5. The ground reference lead according to claim 1, further comprising a ground socket cover having a mounting surface configured such that the ground socket is held in place using a human hand, a robotic arm, and/or tools.

6. A measuring apparatus for measuring high frequency electrical signals on a DUT, the measuring apparatus comprising
   a. a probe head having an electrical signal input port, and a high impedance ground connection port,
   b. an electrical signal input tip mounted to the electrical signal input port, and
   c. the ground reference lead according to claim 1 mounted to the high impedance ground connection port via the probe socket.

7. A method of using the ground reference lead of claim 1 to measure high frequency electrical signals on a DUT, the method steps comprising
   a. mounting an electrical signal input tip to an electrical signal input port of the probe head,
   b. mounting the ground reference lead of claim 1 to a high impedance ground connection port of the probe head by connecting the probe socket of the ground reference lead to the high impedance ground connection port,
   c. powering the probe head and connecting it to a data acquisition device,
   d. contacting a signal line on the DUT with a probe tip,
   e. contacting a ground pad on the DUT with a ground tip,
   f. performing a measurement of high frequency electrical signals at no substantial self-inductance driven signal quality loss.

8. A ground reference lead, comprising:
   a flexible body comprising an electrically conductive core and an electrically insulating cover,
   a probe socket arranged on a probe end of the flexible body,
   a ground socket arranged on a ground end of the flexible body,
   an electrical contact pathway that electrically connects the probe socket and the ground socket and that extends at least partially within the flexible body, and
   a resistor, and
   wherein the flexible body has a total thickness of less than 0.8 mm, and
   wherein a probe socket plate is mounted to a front side of the flexible body and the resistor is mounted to a back side of the flexible body, and wherein a ground socket plate is mounted to a front side of the flexible body.

9. The ground reference lead according to claim 8, wherein the flexible body has a strip shape and comprises a copper strip covered by a glass-reinforced epoxy laminate material.

10. A measuring apparatus for measuring high frequency electrical signals on a DUT, the measuring apparatus comprising:
    a. a probe head having an electrical signal input port, and a high impedance ground connection port,
    b. an electrical signal input tip mounted to the electrical signal input port, and
    c. the ground reference lead according to claim 8 mounted to the high impedance ground connection port via the probe socket.

11. A method of using the ground reference lead of claim 8 to measure high frequency electrical signals on a DUT, the method steps comprising
    a. mounting an electrical signal input tip to an electrical signal input port of the probe head,
    b. mounting the ground reference lead of claim 8 to a high impedance ground connection port of the probe head by connecting the probe socket of the ground reference lead to the high impedance ground connection port,
    c. powering the probe head and connecting it to a data acquisition device,
    d. contacting a signal line on the DUT with a probe tip,
    e. contacting a ground pad on the DUT with a ground tip,
    f. performing a measurement of high frequency electrical signals at no substantial self-inductance driven signal quality loss.

12. A method of using the ground reference lead of claim 8 to measure high frequency electrical signals on a DUT, the method steps comprising
    a. mounting an electrical signal input tip to an electrical signal input port of the probe head,
    b. mounting the ground reference lead of claim 8 to a high impedance ground connection port of the probe head by connecting the probe socket of the ground reference lead to the high impedance ground connection port,
    c. powering the probe head and connecting it to a data acquisition device,
    d. contacting a signal line on the DUT with a probe tip,
    e. contacting a ground pad on the DUT with a ground tip,
    f. performing a measurement of high frequency electrical signals at no substantial self-inductance driven signal quality loss.

13. A ground reference lead, comprising:
    a flexible body comprising an electrically conductive core and an electrically insulating cover, a probe socket arranged on a probe end of the flexible body, a ground socket arranged on a ground end of the flexible body, an electrical contact pathway that electrically connects the probe socket and the ground socket and that extends at least partially within the flexible body, a resistor, and wherein the probe socket plate and/or the ground socket plate are made of an electrically insulating material, and each comprise a through-hole for the electrically conducting pathway.

14. The ground reference lead according to claim 13, wherein the resistor is a probe end resistor and/or a ground end resistor.

15. A measuring apparatus for measuring high frequency electrical signals on a DUT, the measuring apparatus comprising:
   a. a probe head having an electrical signal input port, and a high impedance ground connection port,
   b. an electrical signal input tip mounted to the electrical signal input port, and
   c. the ground reference lead according to claim 13 mounted to the high impedance ground connection port via the probe socket.

* * * * *